United States Patent
Ahlgren et al.

(10) Patent No.: US 7,217,988 B2
(45) Date of Patent: May 15, 2007

(54) BIPOLAR TRANSISTOR WITH ISOLATION AND DIRECT CONTACTS

(75) Inventors: David C. Ahlgren, Wappingers Falls, NY (US); Gregory G. Freeman, Hopewell Junction, NY (US); Francois Pagette, Fishkill, NY (US); Christopher M. Schnabel, Poughkeepsie, NY (US); Anna W. Topol, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,905

(22) Filed: Jun. 4, 2004

(65) Prior Publication Data

US 2005/0269664 A1    Dec. 8, 2005

(51) Int. Cl.
  *H01L 27/082* (2006.01)
(52) U.S. Cl. ............ 257/584; 257/565; 257/621; 257/698
(58) Field of Classification Search .......... 257/698, 257/621, 565, 578, 584
See application file for complete search history.

(56) References Cited

U.S. PATENT DOCUMENTS

| | | | |
|---|---|---|---|
| 3,676,714 A * | 7/1972 | Wensink et al. | ............ 327/565 |
| 4,870,475 A | 9/1989 | Endo et al. | |
| 5,294,823 A | 3/1994 | Eklund et al. | |
| 5,332,920 A | 7/1994 | Nakagawa et al. | |
| 5,757,081 A | 5/1998 | Chang et al. | |
| 5,767,578 A | 6/1998 | Chang et al. | |
| 5,841,197 A | 11/1998 | Adamic, Jr. | |
| 6,114,768 A | 9/2000 | Gaul et al. | |
| 6,140,170 A | 10/2000 | Shibib | |
| 6,392,290 B1 | 5/2002 | Kasem et al. | |
| 6,414,371 B1 * | 7/2002 | Freeman et al. | ............ 257/584 |
| 6,482,710 B2 * | 11/2002 | Oda et al. | ............ 438/311 |

\* cited by examiner

*Primary Examiner*—Sara Crane
(74) *Attorney, Agent, or Firm*—Joseph P Abate; Greenblum & Bernstein, P.L.C.

(57) ABSTRACT

A bipolar transistor has a collector that is contacted directly beneath a base-collector junction by metallization to reduce collector resistance. A conventional reach-through and buried layer, as well as their associated resistance, are eliminated. The transistor is well isolated, nearly eliminating well-to-substrate capacitance and device-to-device leakage current. The structure provides for improved electrical performance, including improved $f_T$, Fmax and drive current.

13 Claims, 9 Drawing Sheets

BIPOLAR TRANSISTOR WITH ISOLATION AND DIRECT CONTACTS

BACKGROUND OF INVENTION

The invention generally relates to bipolar transistor fabrication and, more particularly, to a heterojunction bipolar transistor (HBT) with isolation and direct contacts to the collector and emitter.

A bipolar junction transistor is typically comprised of two back-to-back p-n junctions that share a thin common region. Contacts are made to all three regions, two outer regions called the emitter and collector and the middle region called the base. The device is called "bipolar" since its operation involves both types of mobile carriers, electrons and holes.

HBTs are bipolar junction transistors that are composed of at least two different semiconductors. As a result, the energy bandgap, as well as all other material properties, can be different in the emitter, base and collector. Moreover, a gradual change also called grading of the material is possible within each region. The use of heterojunctions provides an additional degree of design freedom, which can result in vastly improved devices compared to the homojunction counterparts.

Improvement of transistor performance, especially operation speed, is an essential requirement for improved network communication and wireless systems. Bipolar transistors with a silicon germanium ("SiGe") intrinsic base deliver the type of performance required for such systems. A SiGe HBT is similar to a conventional silicon ("Si") bipolar transistor except for the base. SiGe, a material with a narrower bandgap than Si, is used as the base material. SiGe HBT speed performance of 350 GHz ($f_T$) has been demonstrated.

Unfortunately, however, collector resistance heavily influences the maximum frequency ($F_{max}$) at which a transistor demonstrates useful (i.e., above unity) current gain. As transistor performance improves, the collector parasitic resistance ($R_c$) becomes a limiting performance factor. High collector parasitic resistance $R_c$ limits $f_T$. Both $f_T$ and the effective $R_c$ time constant (principally a function of base transit time and collector space-charge transit time) limit $F_{max}$.

Referring to FIG. 1, the structure of a related bipolar transistor 100 includes a collector 130 contacted by a buried layer (also called a subcollector) 120 and a reachthrough 140. The buried layer 120 provides a horizontal path from beneath the active region of the transistor 100 to the reachthrough 140. The reachthrough 140 provides a vertical path from the buried layer 120 to the surface of the device. The buried layer 120 is formed by high dose ion implantation followed by high temperature anneal and silicon EPI layer deposition. Depth trench isolation 110 and 115 and shallow trench isolation 125, 135 and 145 are formed. The shallow trench isolation 135 and 145 defines an area at the surface of the wafer for the reachthrough 140. A doping implant and anneal complete the formation of the reachthrough 140. The active part of the bipolar transistor 100 is formed on the Si EPI layer 130. Polysilicon emitter 175 and extrinsic base 155 and 160 regions are separated by dielectric 165 and 170. Following dielectric layer deposition, vias 180 and 185 and metallization are formed on the top surface of the structure to provide emitter 194, base 196, and collector 192 electrodes.

Such conventional structures face several drawbacks. One drawback relates to collector parasitic resistance, $R_c$, which has three main components: the resistance vertically from the collector-base 130–150 junction to the buried layer 120, the resistance along the buried layer 120, and the resistance from the buried layer 120 up to the collector contact 192. As $f_T$ increases, $R_c$ increases thereby limiting $F_{max}$. Furthermore, because conventional HBTs are partially isolated, one to another, by a depth-trench that surrounds the device and by high doping implant regions around the depth-trench, well-to-substrate capacitance and device-to-device leakage current can affect negatively the device performance.

Embodiments of the invention are directed to overcoming one or more of the problems as set forth above.

SUMMARY OF INVENTION

An embodiment of the invention includes a device, comprising an active region including a collector region and an oxide layer formed over the collector region and having a conductive pathway in electrical contact with the collector region. The device also includes a collector metal contact deposited over the oxide layer and the conductive pathway; wherein the conductive pathway through the oxide layer provides electrical contact between the collector metal contact and the collector region.

Another embodiment of the invention includes a semiconductor device, comprising an emitter region and a base region deposited on a surface of the emitter region. The device also includes a passivation layer deposited about the emitter region and about an edge of the base region and a collector region deposited on the base region and electrically isolated from a substrate. The device further includes an oxide layer deposited about at least one side and on a surface of the collector region.

Another embodiment of the invention includes a method of fabricating a device, comprising depositing a base layer on a first side of a collector layer and depositing an emitter layer on the base layer. The method also includes depositing a first oxide layer on a second side of the collector layer and etching a via through the first oxide layer from a top surface of the first oxide layer to the second side of the collector layer. The method further includes filling the via with a conductor to form an electrical pathway to the collector through the first oxide layer.

DETAILED DESCRIPTION

Figure 1:
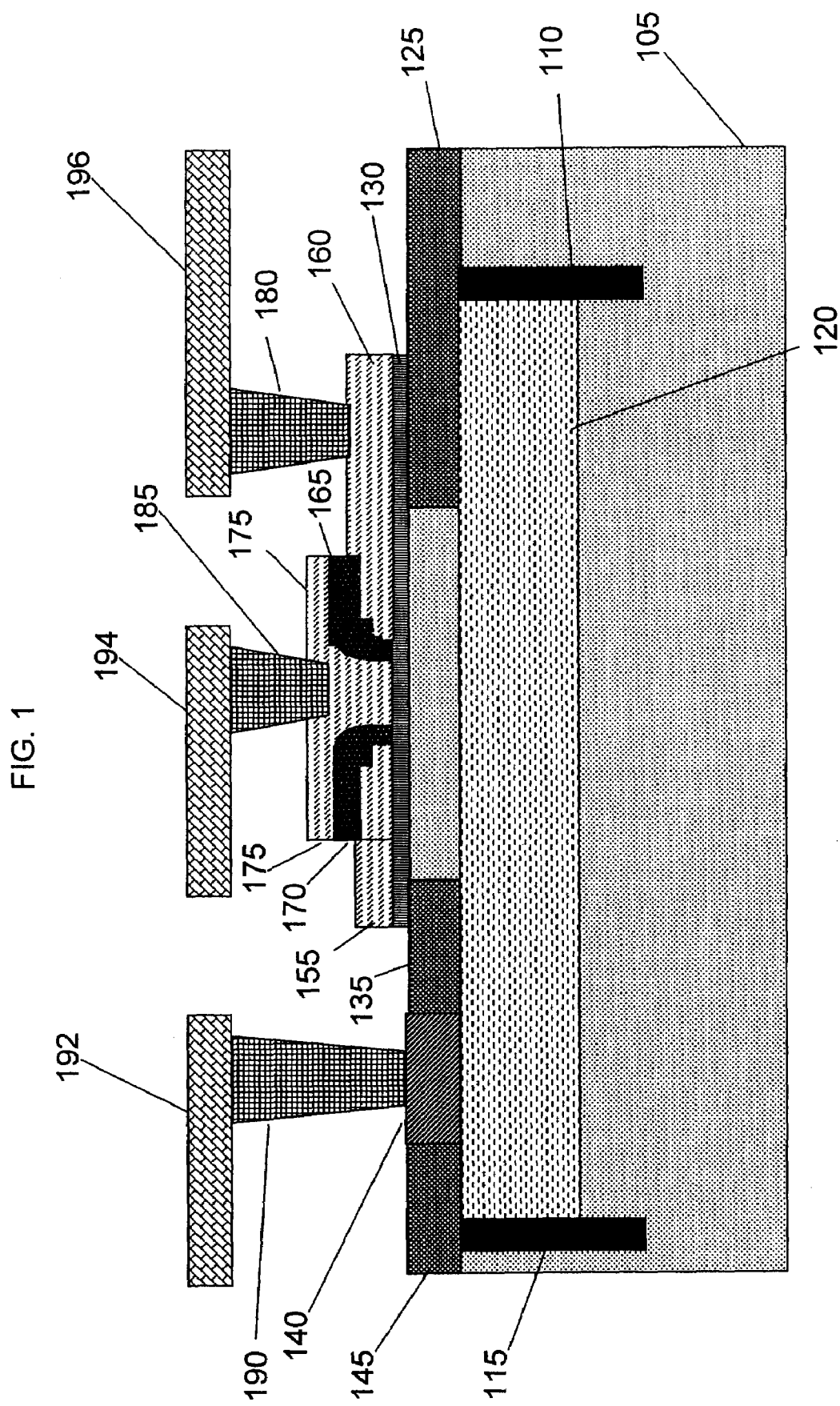
FIG. 1 is an illustration of a related art bipolar transistor.

The invention relates to a bipolar transistor with the collector contacted directly by metallization to reduce collector resistance and layout dimension. The transistor is also suitable for circuit integration. The conventional reachthrough 140 and buried layers 120 (as shown in FIG. 1) are eliminated, as well as their associated resistance. Also, the transistor is substantially isolated, nearly eliminating well-to-substrate capacitance and device-to-device leakage current. Consequently, the structure provides for improved electrical performance, including improved $f_T$, $F_{max}$ and drive current.

Figure 2:
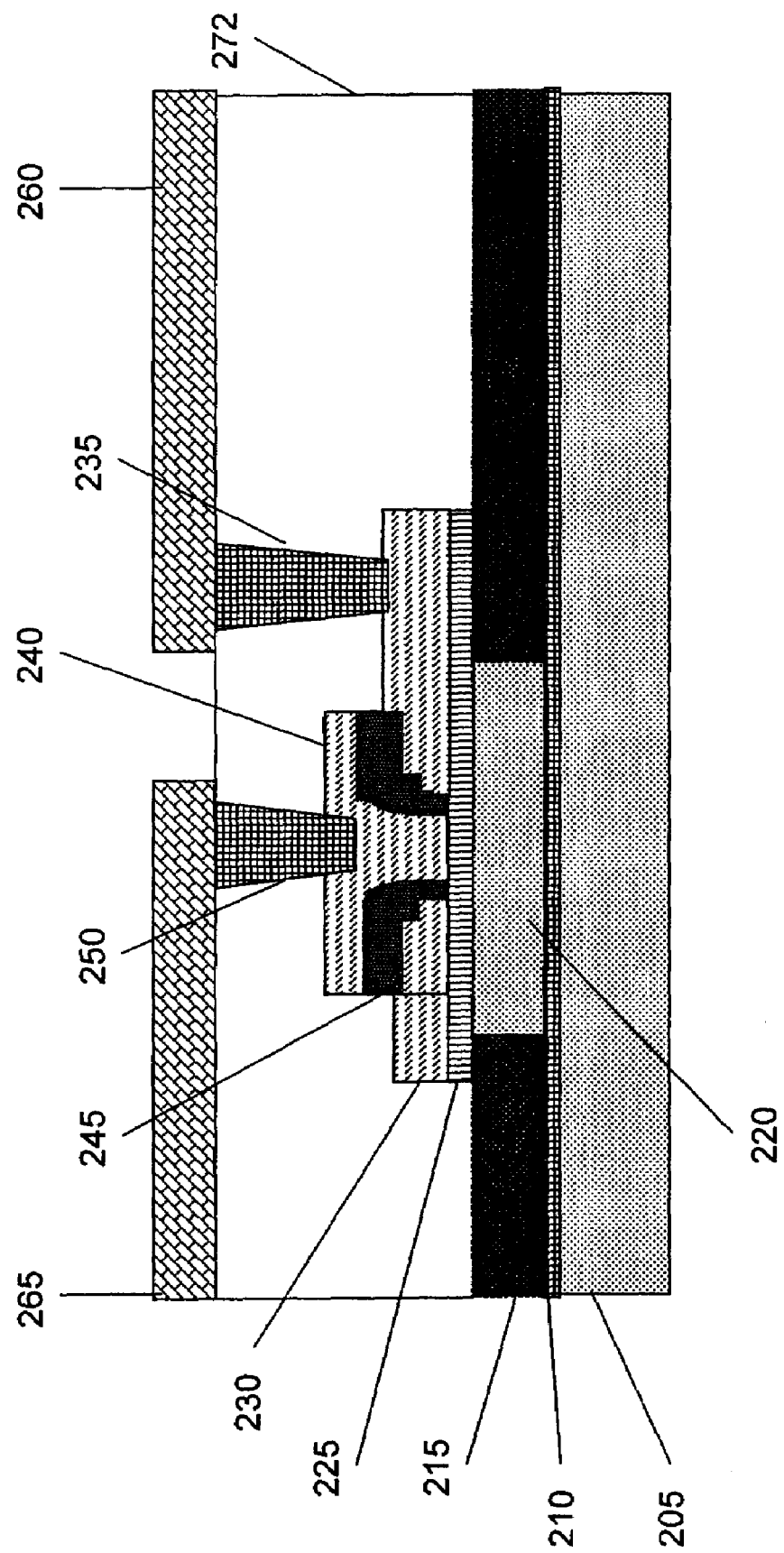
FIGS. 2–8 illustrate fabrication steps in accordance with an embodiment of the invention.

Referring to FIG. 2, an exemplary starting material is a p-type, lightly doped (~$10^{15}$ cm$^{-3}$), oriented, polished silicon wafer 205. An buried oxide layer (BOX) 210 is formed on top of the silicon substrate 205. Buried oxide layer 210 can have any suitable thickness. An N-type epitaxial layer (N-EPI) 220 may be formed on buried layer 210. N-EPI layer 220 can be formed using any conventional process, such as atmospheric chemical vapor deposition (CVD).

After forming the N-EPI layer 220, active areas are defined such as, for example, by using a conventional shallow-trench isolation process to form oxide regions 215. The oxide regions 215 are deposited on top of the varied layer 210 and against edges of collector 220. The oxide regions 215 can be deposited by any of the conventional methods known in the art, such as, for example, chemical vapor deposition (CVD). After the oxide regions 215 and collector 220 have been deposited, their top surfaces are planarized to form a level surface across the collector 220 and adjoining oxide regions 215 using, for example, chemical mechanical etching.

Once the collector 220 and oxide regions 215 have been planarized, a base region 225 formed of SiGe is deposited over the collector 220 and portions of the oxide regions 215. The SiGe base region 225 is deposited so that it covers the entire collector 220 but covers only portions of each adjoining oxide region 215, and may be formed by any suitable method well known in the art.

After the SiGe base region 225 is formed, a polysilicon extrinsic base region 230, oxide regions 245, and emitter polysilicon region 240 are formed across the surface of the SiGe base region 225. The polysilicon extrinsic base region 230 may also be referred to as a polysilicon extrinsic base. Each one of the polysilicon extrinsic base region 230, oxide regions 245 and emitter polysilicon 240 contact the SiGe base region 225. The emitter polysilicon 240 is disposed proximate the center of the polysilicon extrinsic base region 230 layer and is separated therefrom on each side by one of the oxide regions 245 using methods well known in the art.

After the polysilicon extrinsic base region 230, oxide regions 245 and emitter polysilicon 240 are formed on the SiGe base region 225, a passivation layer 272 is deposited. The passivation layer 272 covers both oxide regions 215, the SiGe base region 225, the polysilicon extrinsic base region 230, the oxide regions 245 and the emitter polysilicon 240. Once the passivation layer 272 is formed, via holes 235 and 250 are formed down to the polysilicon extrinsic base region 230 and the emitter polysilicon 240, respectively. The via holes 235 and 250 may be formed by isotropic etching and are at least partially filled with a conductor such as, for example, metallization on the surface of each via. The via holes 235 and 250 thus make electrical contact to the extrinsic base polysilicon 230 and emitter polysilicon 240 respectively, through the passivation layer 272.

After the via holes 235 and 250 are formed, each via hole, 235 and 250, receives a metal contact at its top. Accordingly, the via hole 235 in contact with the extrinsic base polysilicon 230 receives a base metal contact 260. The base metal contact 260 thus acts as a contact point for electrical communication with the extrinsic base polysilicon 230. Likewise, the emitter via hole 250 receives an emitter metal contact 265. The emitter metal contact 265 thus provides a contact point for electrical communication through the emitter via hole 250 with the emitter polysilicon 240. The metal contact may be, for example, aluminum, tungsten, copper, or any other metal suitable for forming a metal contact.

As can be seen, the above described procedure is an example of a conventional bipolar processing from shallow trench to metal layer. However, it should be noted that the invention is compatible with many other types of bipolar processing methods well known in the art. Thus the method described above is used only for illustration purposes.

Figure 3:
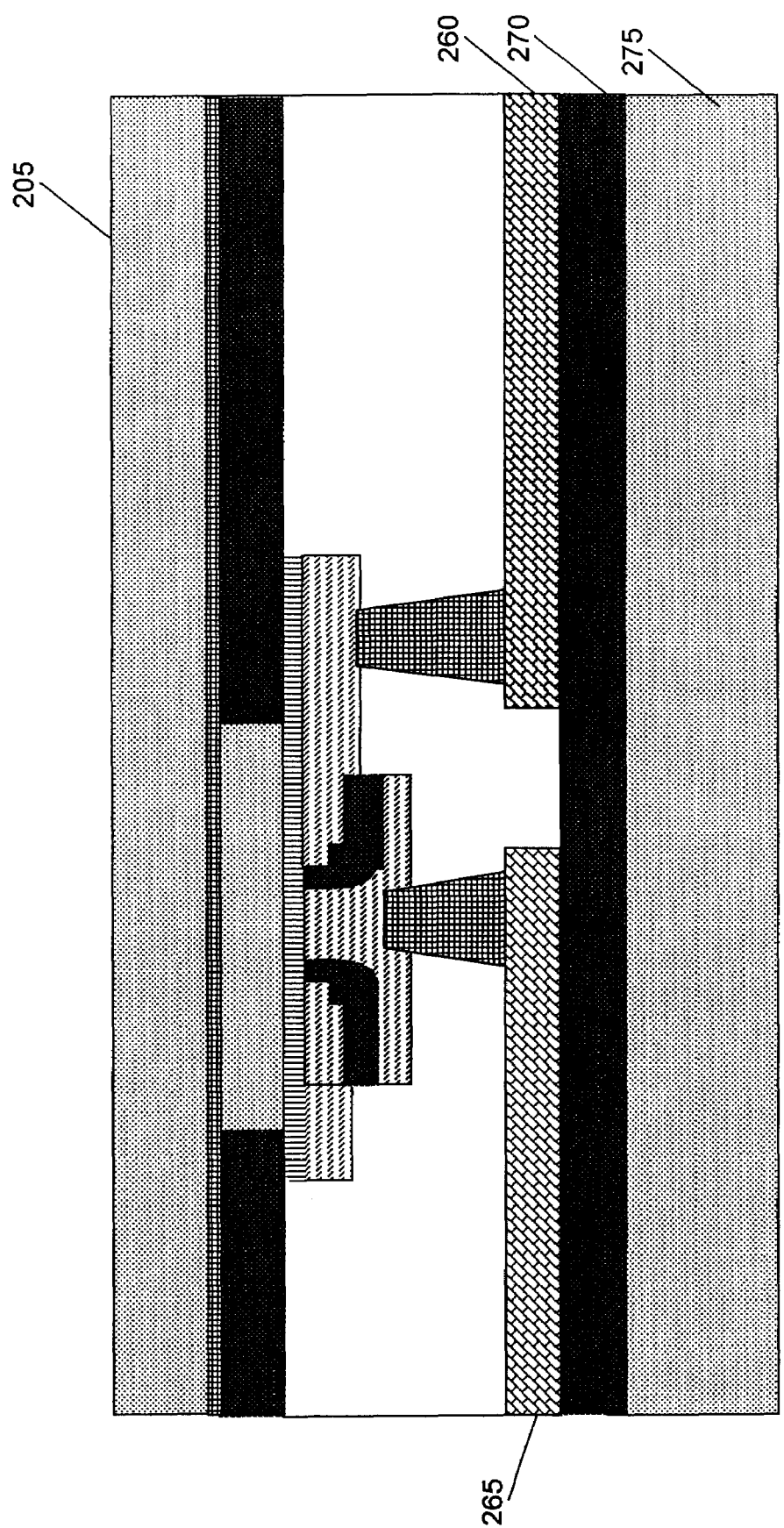

Referring to FIG. 3, the method includes the structure of the HBT shown in FIG. 2 being "flipped" over so that the base metal contact 260 and the emitter metal contact 265 are at the bottom of the structure, and the silicon substrate 205 is at the top of the structure. to being flipped over, the second oxide layer 270 is deposited on the base metal contact 260. structure is then "flipped" over and the second silicon substrate 275 is bonded to an oxide layer forming part of the oxide layer 270. the HBT structure is bonded to the second oxide layer 270 at the base metal contact 260 and emitter metal contact 265. This particular process is based on direct fusion of wafer-level oxide-oxide based bonding in which no nonstandard materials (such as adhesive interlayers) are introduced to ensure compatibility with conventional semiconductor processing.

Such bonding method is well known in the art, and usually consists of the following processing steps: surfaces of the thermally grown oxide films are at first pushed together at room temperature to bond one to another, after which the heat treatment is carried out in order to form covalent bonds and thus strengthen the bonding between the two interfaces. Wafer bonding has become virtually standard in SOI substrate preparation SOI substrates made by wafer bonding are available commercially (see for example SOITEC: www.soitec.com) and is used extensively for MEMS device fabrication, applications that tolerate high temperature processing (often >1000° C.). lower temperature processing cycle (<500° C.) can be accomplished by optimized bonding protocols using variety of surface preparation methods in order to provide adequate surface smoothness and flatness, surface cleanliness, and surface reactivity of the joining oxide surfaces. surface preparation methods may include but are not limited to chemical surface pre-treatments, plasma-based pre-treatments annealing cycles for defect reduction and CMP processes for enhanced interface smoothness.

Another bonding method based on incorporation of adhesive interlayers may also be used in creation of HBT structure. bonding is accomplished by depositing an intermediate layer on one or both of the bonded surfaces, contacting the two wafers, and applying temperature (processes using temperature below 400° C. are available) and force (up to 40 kN). Wafer level using low-k dielectric glues as bonding agents have been reported for 3D ICs applications. all these bonding methods, a variety of parameters can be adjusted, such as choice of ambient, applied pressure, temperature, and surface pre-treatments. or all of these parameters need to be employed in order to create a strong, void-free bonding.

Independently of the bonding method used the final structural configuration consists of the HBT sandwiched between the first silicon substrate 205 at the top of the structure, and the second silicon substrate 275 at the bottom of the structure.

Figure 4:
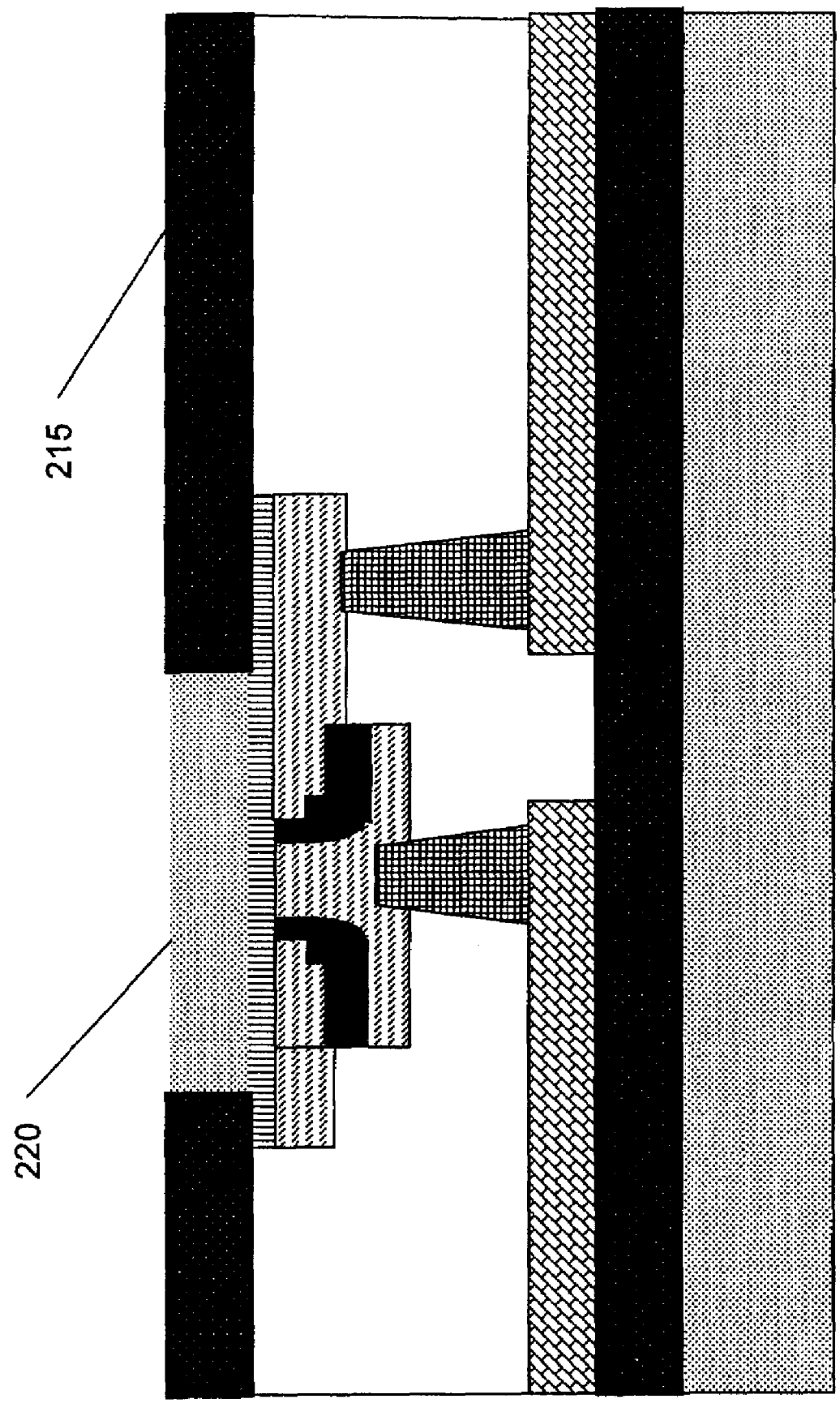

Referring to FIG. 4, the first silicon substrate 205 is removed by any of the methods well known in the art for removing silicon layers such as grinding or chemical mechanical etching (CMP), for example. After the first silicon substrate 205 is removed, the buried oxide layer 210 is next removed. The buried layer 210 may be removed by any of the methods for removing buried layers well known in the arts such as, for example chemical etching. After the first silicon substrate 205 and the buried layer 210 are removed, the oxide regions 215 and the collector 220 are left exposed at the top of the HBT structure.

Figure 5:
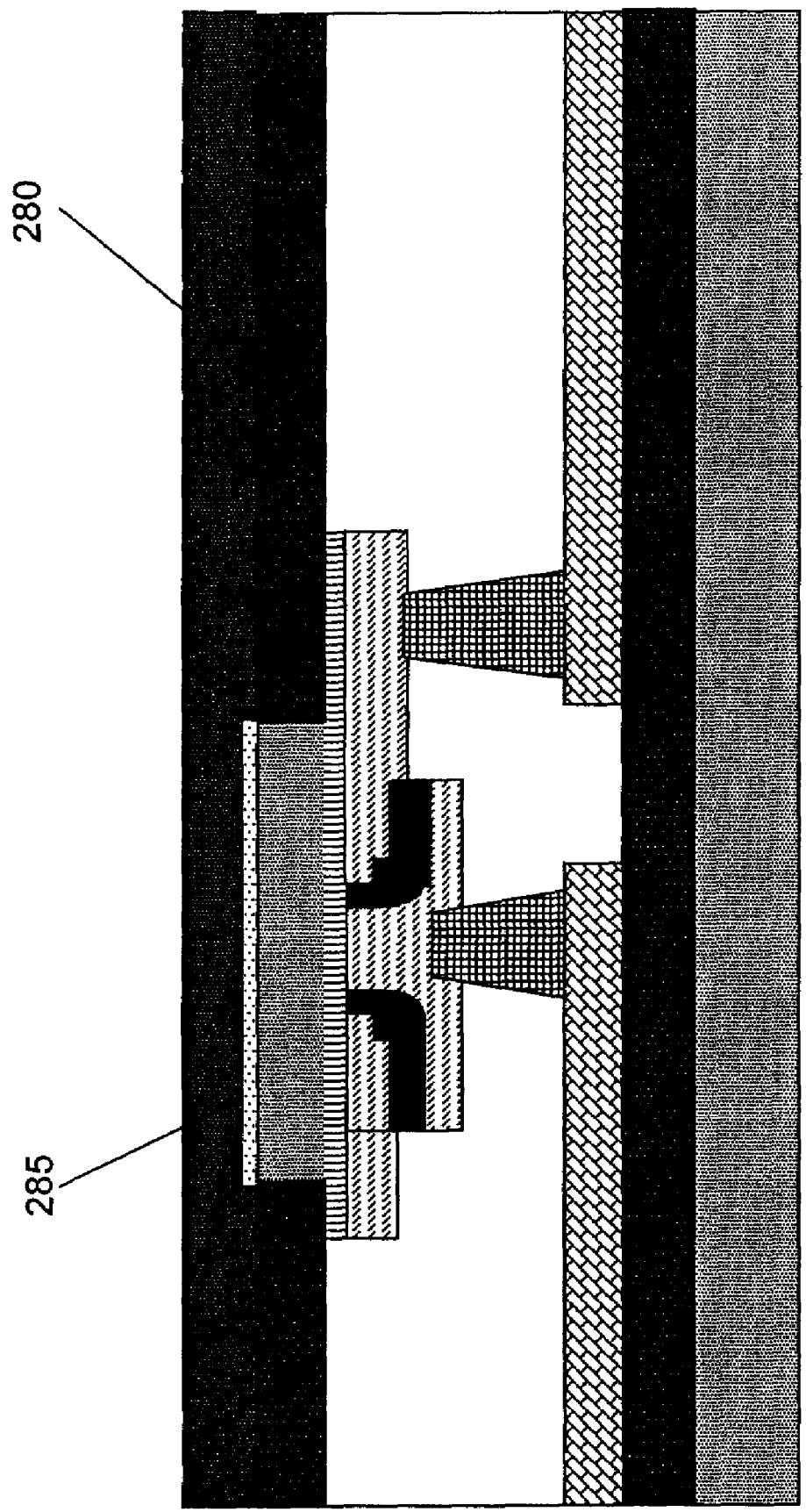

Referring to FIG. 5, after the first silicon substrate 205 is removed, an optional implant step may be performed to tailor the collector 220 and collector contact surface using methods well known in the art. A silicide layer 285 is optionally deposited over the collector 220. The silicide layer 285 provides a low resistance layer for further electrical contact to the collector 220. Once the silicide layer 285 has been deposited, an oxide 280 is deposited over the first oxide 215 and the silicide layer 285.

Figure 6:
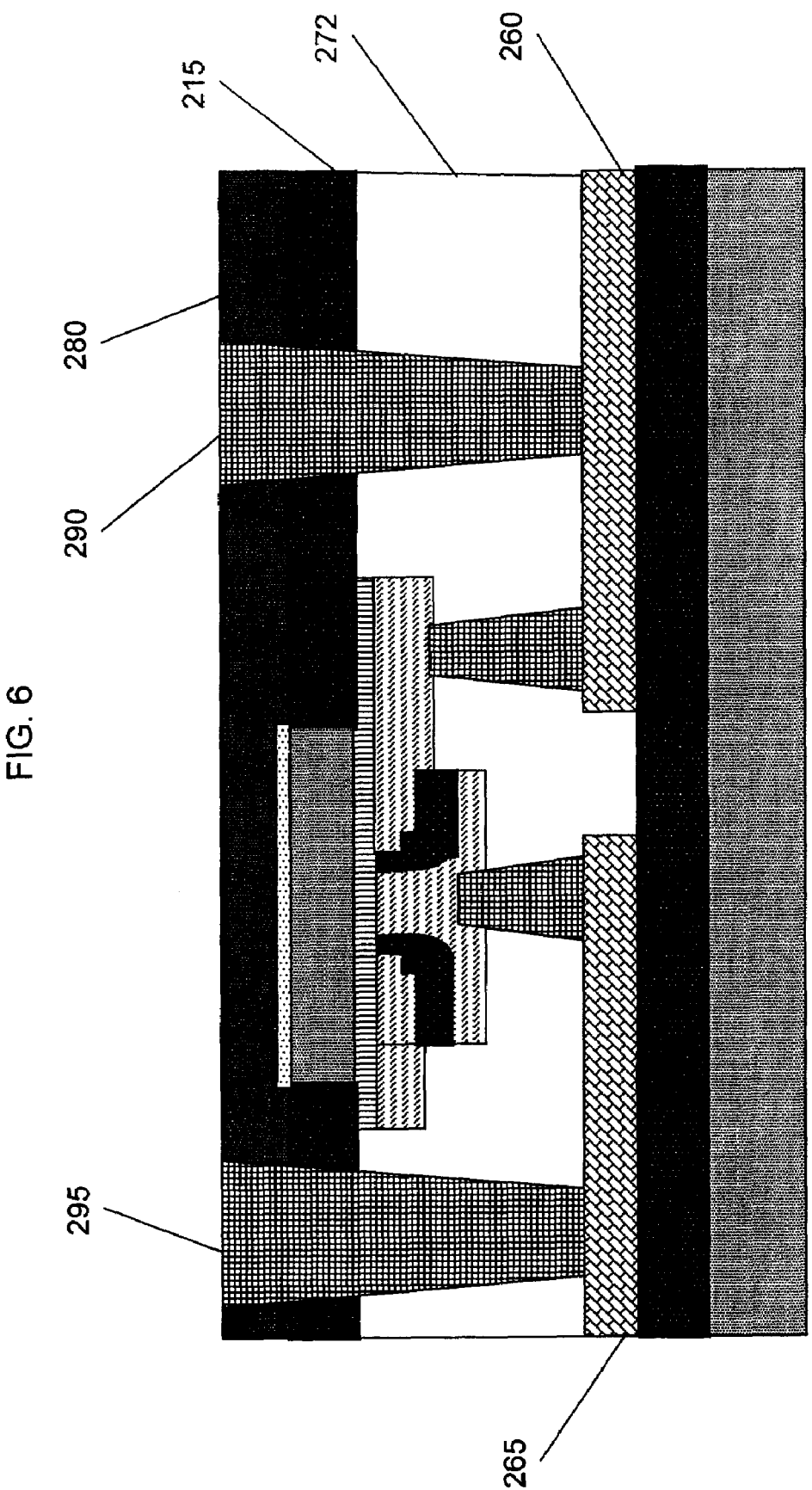

Referring to FIG. 6, after the third oxide layer 280 is formed, via holes are etched to provide electrical contact to the SiGe base region 265 and emitter polysilicon 260. In particular, a base contact via 290 is formed by etching a hole through the third layer 280, the first oxide layer 215, and the passivation layer 272 to make contact with the base metal contact 260. An emitter contact via hole 295 is also etched through the oxide layer 280, first oxide layer 215, and the passivation layer 272 to make contact with the emitter metal contact 265. Once formed, the base contact via hole 290 and the emitter contact hole via 295 are metalized and thus provide electrical contact to the base metal contact 260 and the emitter metal contact 265, respectively.

Figure 7:
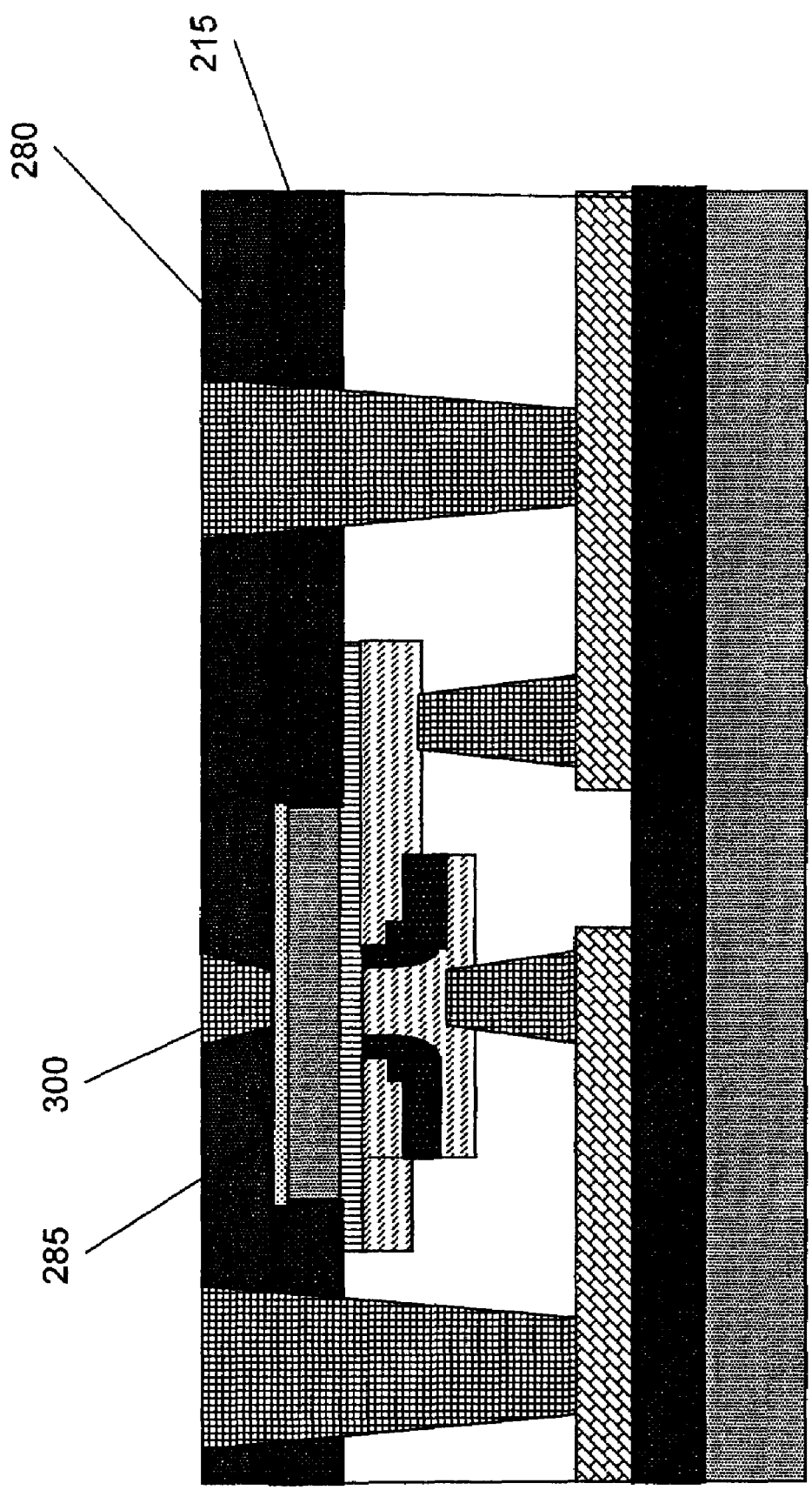

Referring to FIG. 7, a collector via 300 is formed by etching a via hole through the oxide 280 to make contact with the silicide layer 285. The collector via hole 300 is metalized and thus provides direct electrical contact through a metalized pathway to the collector 220 from what is now the top of the HBT structure. As can be seen, the collector via 300 thus provides a short electrical path to the collector 220. By positioning the collector via hole 300 and the collector 220 at the top of the HBT structure, the need for a sub collector is eliminated and a relatively short pathway to the collector 220 is provided. Accordingly, parasitic resistance along the buried layer or so sub collector is eliminated. Additionally, well to substrate capacitance and device-to-device leakage current can be reduced or eliminated.

Figure 8:
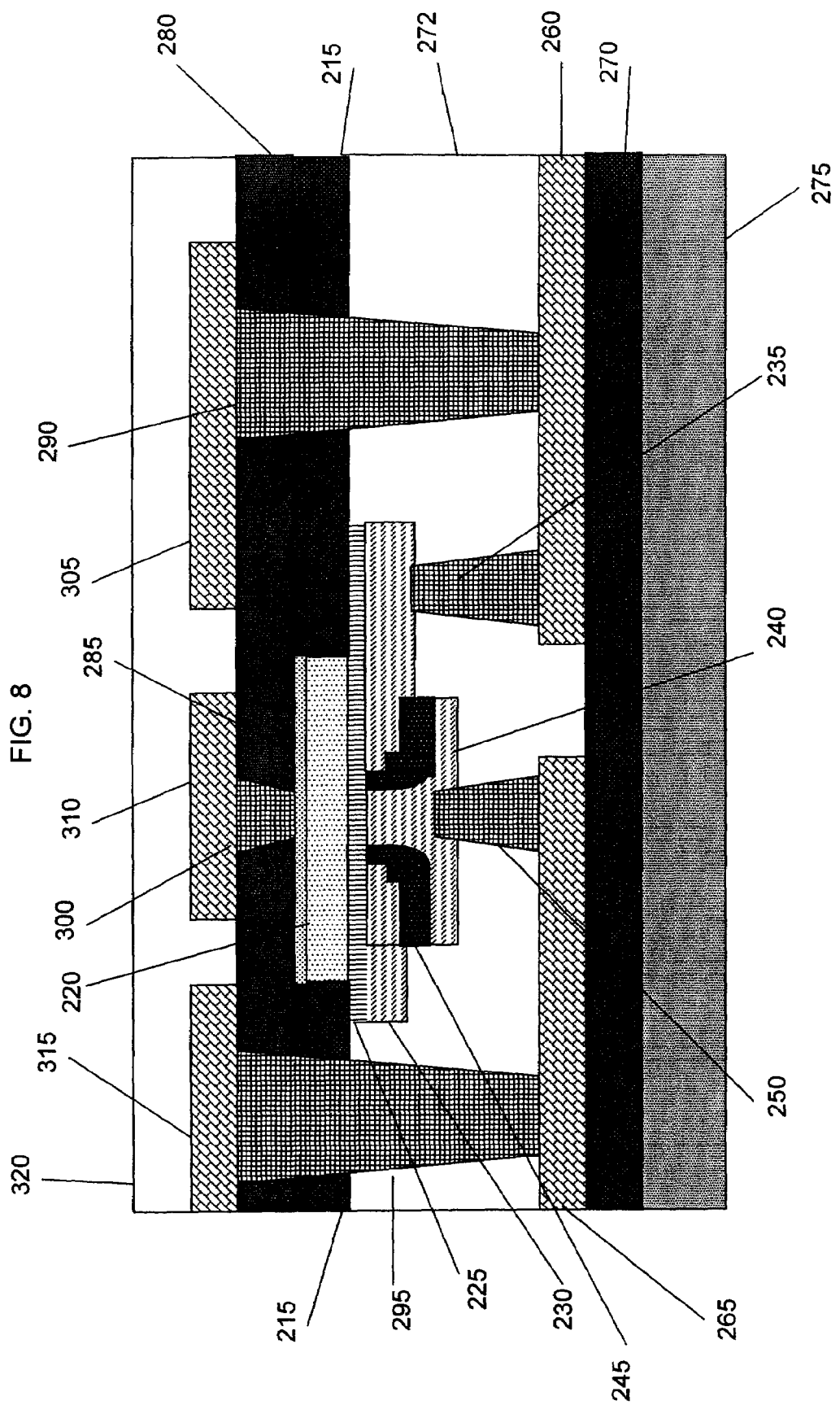

Referring to FIG. 8, a base metal contact 305 is deposited on top of the oxide 280 and in contact with the base contact via 290. Also, a collector metal contact 310 is formed on top of the third oxide 280 in contact with the collector via 300. Additionally, an emitter metal contact 315 is deposited on top of the third oxide 280 in contact with the emitter contact via 295. After the base metal contact 305, collector metal contact 310 and emitter metal contact 315 are formed. A passivation layer 320 is formed on the layers 315, 310, 305 and 280.

FIG. 8 shows a completed structure of an embodiment of the invention. Describing the embodiment from the bottom to the top of the device, as shown in FIG. 8, the lower portion of the device includes what is referred to as a second Si substrate 275. On top of the second Si substrate 275 is deposited an oxide layer 270. Deposited on the oxide layer 270 is a base metal contact 260 and an emitter metal contact 265. Each of the base metal contact 260 and emitter metal contact 265 extend across a portion of the oxide 270. On top of the base metal contact 260 and the emitter metal contact 265 and also in contact with a portion of the oxide 270 between the two contacts, is a passivation layer 270. In an upper portion of the passivation layer 270 is the active region of the device.

An emitter polysilicon layer 240 is disposed in the upper portion of the passivation layer 270. Surrounding a portion of the emitter polysilicon area 240 are oxide regions 245. Surrounding oxide regions 245 is an extrinsic base polysilicon layer 230. Each one of these layers makes contact and is partially surrounded by the passivation layer 270. Making contact across the top of the extrinsic base polysilicon 230, oxide region 245 and emitter polysilicon 240 is a SiGe base region 225. On top of a portion of the SiGe base region 225 is the collector 220. Disposed on top of the collector 220 is a silicide layer 285. The collector 220 is disposed on top of the SiGe base region 225 in such a manner that the collector 220 covers only a portion of the SiGe base region 225. Additionally, the collector 220 may be deposited to cover the entire top of the SiGe base region 225.

Deposited on the exposed portion of the SiGe base region 225 and surrounding the collector 220 is a first oxide layer 215. The first oxide layer 215 is formed through processes such that the top of the first oxide layer 215 and the top of the collector 220 are substantially level with one another. On top of the first oxide 215 and silicide layer 285 is disposed a third oxide layer 280. On top of the third oxide layer 280 is an emitter metal wire 315 covering a portion of the third oxide layer 280, a collector metal wire 310 covering a portion of the third oxide layer 280, and a base metal wire 305 covering a portion of the third oxide layer 280.

The device also contains various vias which are at least partially filled with a conductor, for example, the surface of the vias may be metalized. An emitter contact via 295 extends between the emitter metal wire 315 on top of the third oxide 280 and the emitter metal contact 265 on top of the oxide layer 270. Accordingly, the emitter contact via 295 passes through the third oxide layer 280, the first oxide layer 215, and the passivation layer 270. A collector via 300 extends between the collector metal contact 310 and the silicide layer 285 passing through the third oxide layer 280. An emitter via 250 extends from the emitter polysilicon 240 to the emitter metal contact 265 passing through the passivation layer 270. A base via 235 extends from the extrinsic base polysilicon 230 to the base metal contact 260 passing through the passivation layer 270. A base contact via 290 extends between the base metal contact 305 on top of the third oxide layer 280 and the base metal contact 260 on top of the oxide layer 270. Thus, the base contact via 290 passes through the third oxide layer 280, the first oxide layer 215, and the passivation layer 270.

Figure 9:
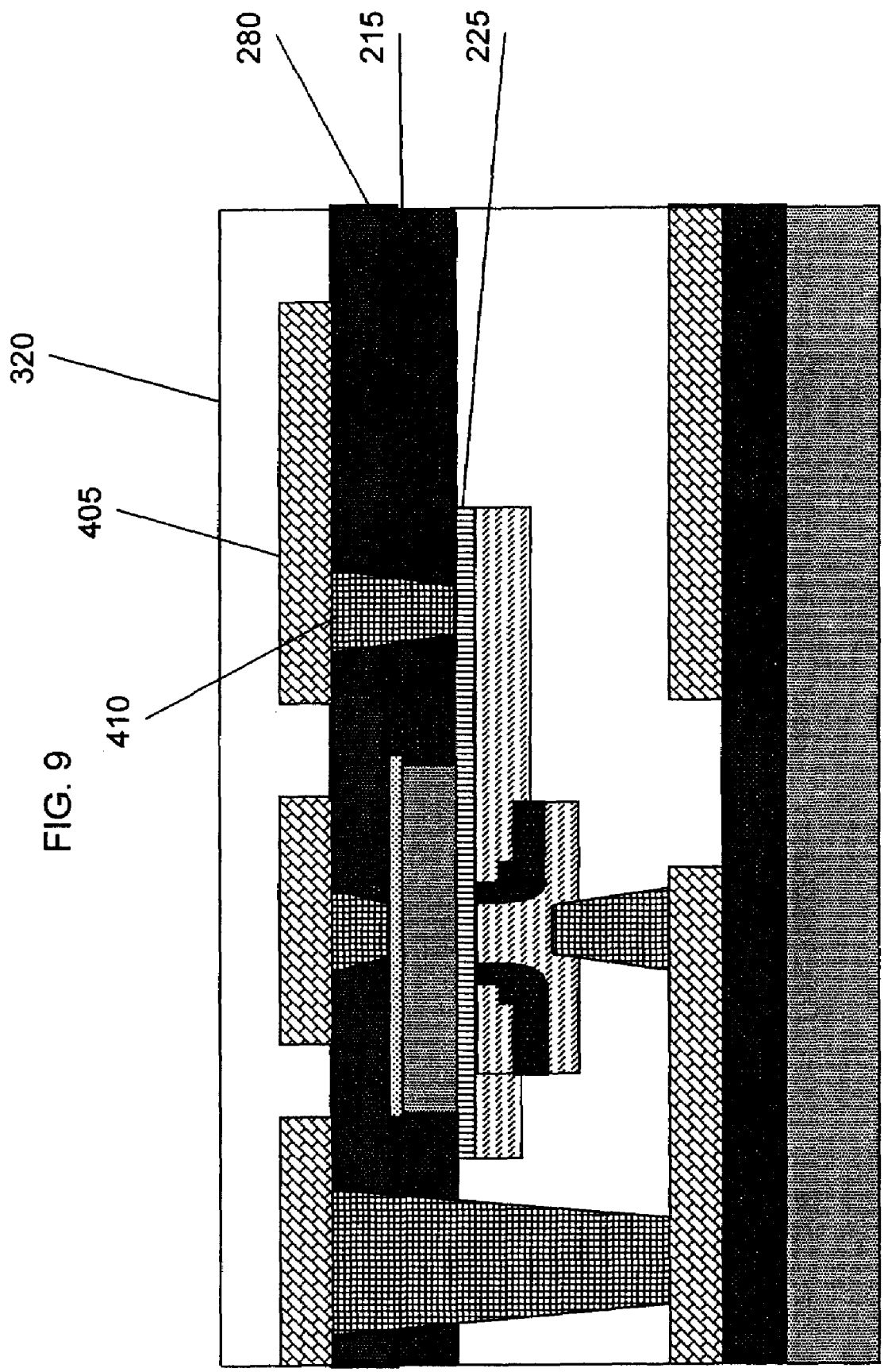
FIG. 9 illustrates an embodiment of the invention.

Referring to FIG. 9, another embodiment of the invention is shown having a direct path to the base. The embodiment of FIG. 9 may be formed where the path includes a base via hole 410 formed through the third oxide 280, the first oxide 215 and in contact with the SiGe base region 225. The base via hole 410 is at least partially filled with a conductor. A base metal contact 405 is formed on top of the third oxide 280 in contact with the base via hole 410. Accordingly, the SiGe base region 225 can now be electrically accessed from the top of the HBT structure through the base metal contact 405 and the base via hole 410. The top of the structure is then covered with a passivation layer 320. It should be noted that this layout may be more compact, but also requires a p-type dopant using methods well known in the art.

While the invention has been described in terms of exemplary embodiments, those skilled in the art will recognize that the invention can be practiced with modifications and in the spirit and scope of the appended claims.

The invention claimed is:

1. A device, comprising:
an active region including a collector region;
an oxide layer arranged on one side of the collector region and having a conductive pathway in electrical contact with the collector region;
a collector metal contact arranged over the oxide layer and the conductive pathway; and
an emitter region arranged on another side of the collector region and in the active region, wherein the conductive pathway through the oxide layer provides electrical contact between the collector metal contact and the collector region.

2. The device of claim 1, wherein a base region is arranged on a top surface of the emitter region, and the collector region is arranged on a surface of the base region.

3. The device of claim 2, further comprising a passivation layer arranged about the emitter region and about the base region, and a second oxide layer disposed around a side of the collector region and in contact with the oxide layer.

4. The device of claim 1, wherein the conductive pathway through the oxide layer from the collector metal contact to the collector region comprises a vertical conductive pathway.

5. The device of claim 1, wherein the conductive pathway through the oxide layer from the collector metal contact to the collector region comprises a metal filled via.

6. The device of claim 1, further comprising a silicide layer disposed between a surface of the collector region and the oxide layer.

7. The device of claim 1, wherein the conductive pathway to the collector region comprises a base metal contact disposed on a top of the oxide layer.

8. The device of claim 7, further comprising a further conductive pathway to at least one of a base region and the emitter region.

9. The device of claim 8, wherein the further conductive pathway includes a first conductive pathway and a second conductive pathway, wherein the first conductive pathway comprises filled vias arranged in the oxide layer, the second oxide layer and the passivation layer and between metal contacts and the emitter region, wherein the second conductive pathway includes a filled via arranged in the oxide layer and the second oxide layer and between a metal contact and the base region.

10. The device of claim 8, wherein the first conductive pathway is arranged in the oxide layer, the second oxide and the passivation layer.

11. The device of claim 10, wherein the first conductive pathway includes filled vias arranged in the oxide layer and the second oxide layer and the passivation layer, and between metal contacts and the emitter region, wherein the second conductive pathway includes a filled via arranged in the oxide layer and the second oxide layer and between a metal contact and the base region.

12. The device of claim 10, wherein the second conductive pathway includes filled vias disposed within the oxide layer and the second oxide layer between a base metal contact and the base region and the emitter region.

13. A semiconductor device, comprising:

an active region including a collector region;

an oxide layer arranged on one side of the collector region and having a conductive pathway in electrical contact with the collector region;

oxide regions disposed against side edges of the collector region;

a collector metal contact arranged over the oxide layer and the conductive pathway;

at least one of a silicide layer and a second oxide layer arranged between the one side of the collector region and the collector metal contact; and an emitter region arranged on another side of the collector region, wherein the conductive pathway through the oxide layer provides electrical contact between the collector metal contact and the collector region.

* * * * *